US008367543B2

(12) United States Patent
Farooq et al.

(10) Patent No.: US 8,367,543 B2
(45) Date of Patent: Feb. 5, 2013

(54) STRUCTURE AND METHOD TO IMPROVE CURRENT-CARRYING CAPABILITIES OF C4 JOINTS

(75) Inventors: Mukta Ghate Farooq, Hopewell Junction, NY (US); Jasvir Singh Jaspal, Poughkeepsie, NY (US); William Francis Landers, Wappingers Falls, NY (US); Thomas E. Lombardi, Poughkeepsie, NY (US); Hai Pham Longworth, Poughkeepsie, NY (US); H. Bernhard Pogge, Hopewell Junction, NY (US); Roger A. Quon, Rhinebeck, NY (US)

(73) Assignee: International Business Machines Corporation, Armonk, NY (US)

( * ) Notice: Subject to any disclaimer, the term of this patent is extended or adjusted under 35 U.S.C. 154(b) by 1194 days.

(21) Appl. No.: 11/308,396

(22) Filed: Mar. 21, 2006

(65) Prior Publication Data
US 2007/0222073 A1 Sep. 27, 2007

(51) Int. Cl.
*H01L 21/44* (2006.01)
*H01L 23/48* (2006.01)
*H01L 23/52* (2006.01)
*H01L 29/40* (2006.01)

(52) U.S. Cl. ........ 438/653; 438/613; 438/614; 257/738; 257/751

(58) Field of Classification Search .................. 257/738, 257/751; 438/613, 614, 653
See application file for complete search history.

(56) References Cited

U.S. PATENT DOCUMENTS

| 2002/0142592 | A1 | 10/2002 | Barth et al. |
| 2004/0113279 | A1 | 6/2004 | Chen et al. |
| 2005/0082678 | A1 | 4/2005 | Barth |
| 2005/0127511 | A1 | 6/2005 | Yang et al. |
| 2005/0127518 | A1 | 6/2005 | Cabral, Jr. et al. |
| 2005/0167837 | A1* | 8/2005 | Cheng et al. ................. 257/751 |
| 2005/0258540 | A1* | 11/2005 | Minda .......................... 257/738 |

FOREIGN PATENT DOCUMENTS

JP 2005-029810 7/2003

OTHER PUBLICATIONS

Kohn, A. et al, Evaluation of electroless deposited Co(W,P) thin films as diffusion barriers for copper metallization, 2001, Micorelectronics Engineering, 55, 297-303.*

* cited by examiner

*Primary Examiner* — Fernando L Toledo
*Assistant Examiner* — Valerie N Newton
(74) *Attorney, Agent, or Firm* — Matthew Zehrer; Roberts Mlotkowski Safran & Cole, P.C.

(57) ABSTRACT

A system and method comprises depositing a dielectric layer on a substrate and depositing a metal layer on the dielectric layer. The system and method further includes depositing a high temperature diffusion barrier metal cap on the metal layer. The system and method further includes depositing a second dielectric layer on the high temperature diffusion barrier metal cap and the first dielectric layer, and etching a via into the second dielectric layer, such that the high temperature diffusion barrier metal cap is exposed. The system and method further includes depositing an under bump metallurgy in the via, and forming a C4 ball on the under bump metallurgy layer.

9 Claims, 6 Drawing Sheets

STRUCTURE AND METHOD TO IMPROVE CURRENT-CARRYING CAPABILITIES OF C4 JOINTS

FIELD OF THE INVENTION

The invention generally relates to the field of semiconductor fabrication and, more particularly, to a high-temperature diffusion barrier metal layer that enables an improved current-carrying ability of controlled collapse chip connections (C4) and method of manufacturing same.

BACKGROUND DESCRIPTION

It is well known in the art that an integrated circuit (IC) device such as a semiconductor chip may communicate with other devices through electrical connections formed with solder balls. These solder balls, commonly referred to as controlled collapse chip connections (C4), are typically comprised of Lead and Tin, or a Lead-free material such as for example, alloys of Tin with Copper, Silver or a combination thereof.

It is also well known in the art that certain solders, particularly the Lead-free and Tin-rich solders, are highly reactive, and therefore require a robust barrier metallurgy under the solder bump in order to withstand aggressive high-temperature storage and electromigration (EM) requirements. Therefore, in a C4 structure, a metal stack known as the under bump metallurgy (UBM) or ball limiting metallurgy (BLM) is typically interposed between the solder bump and the IC device.

Historically, an Aluminum layer is interposed between the UBM and the IC device, for reasons such as internal wiring. Aluminum may also be used as a capping material to protect against oxidation of the terminal Copper metallurgy on the device. This cap structure, however, has performance and process integration limitations. Aluminum, and its associated liners (Ta/TaN/Ti/TiN), as a terminal metallurgy for the device is typically deposited as a film in the range of one (1) to two (2) microns. This metallurgical stack contributes to the series resistance of the circuit, and limits the current-carrying capability of the C4 joint.

Although the Aluminum layer, and its associated liners, are typically deposited directly on the Copper line, multiple additional dielectric layers, including a Nitride cap and Oxide and Nitride layers, are generally interposed between the dielectric layer and the Aluminum layer, for reasons well known in the art, such as adhesion. The fabrication of these additional dielectric layers typically requires multiple etches.

It is also known in the art that a Cobalt-based capping layer may be interposed between the UBM and the IC device, specifically on the metal contacts of the IC device. This Cobalt-based capping layer further improves EM resistance and stress migration.

Thus it is desirable to build a C4 structure that is more reliable, can withstand higher temperatures, and that has a lower series resistance such that the current-carrying capabilities of the C4 structure are improved.

SUMMARY OF THE INVENTION

In a first aspect of the invention is described a method depositing a metal layer in a dielectric layer. The method further includes depositing a high temperature diffusion barrier metal cap on the metal layer. The method further includes depositing a second dielectric layer on the high temperature diffusion barrier metal cap and the first dielectric layer, and etching a via into the second dielectric layer, such that the high temperature diffusion barrier metal cap is exposed. The system and method further includes depositing an under bump metallurgy in the via, and forming a C4 ball on the under bump metallurgy layer.

In a second aspect of the invention a method comprises depositing a high temperature diffusion barrier metal cap on a metal layer. The method further includes depositing a dielectric layer on the high temperature diffusion barrier metal cap and etching into the dielectric layer to form a via and expose the high temperature diffusion barrier metal cap. The method further includes depositing an under bump metallurgy in the via, and forming a solder ball on the under bump metallurgy layer.

In a third aspect of the invention a device comprises a C4 joint having a high temperature diffusion barrier metal cap on the metal contacts.

DETAILED DESCRIPTION OF EMBODIMENTS OF THE INVENTION

The invention is generally directed to a system and method for improving current-carrying capabilities of a C4 joint. The system and method of the present invention employ diffusion barrier metals that can withstand higher temperatures. Additionally, the present invention enables lower series resistance and, therefore, higher local current densities in the interface between the last level Copper and the C4 solder. Higher electromigration (EM) resistance is provided by the use of the improved set of materials. This results in higher reliability of the IC chip, thus increasing its life span. The method of the present invention further reduces the cost of fabrication by reducing the number of etches and materials required in production.

Figure 1:
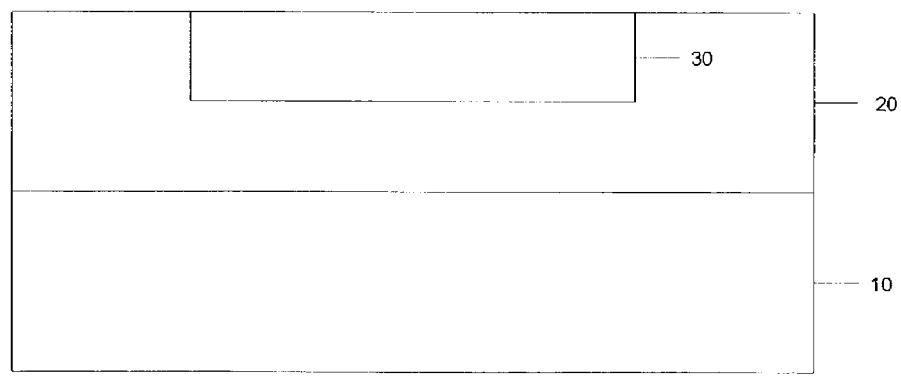
FIG. 1 through 6 are representative of sectional schematic views of processing step(s) in accordance with the invention (not to scale).

FIG. 1 is a sectional schematic view (not to scale) of a substrate, generally denoted by reference to numeral 10. The substrate 10 may be any conventional material such as, for example, Silicon. In FIG. 1, a first dielectric layer 20 is deposited on the substrate 10, using any known method, such as, for example, plasma enhanced chemical vapor deposition (PECVD), chemical vapor deposition (CVD), spin-on coating or other processes. In FIG. 1, a metal layer 30 is formed, embedded into the first dielectric layer 20, by any conventional manner such as, for example, lithography. The metal layer 30, in a preferred embodiment, may be a Copper line.

Although FIG. 1 is a single-level structure, i.e. single level wiring layer, shown for illustrative purposes, it should be understood by those of skill in the art that the structure shown and described herein can be a multi-level structure of several layers. The methods of manufacturing described herein are equally applicable to such a multi-level structure.

Figure 2:
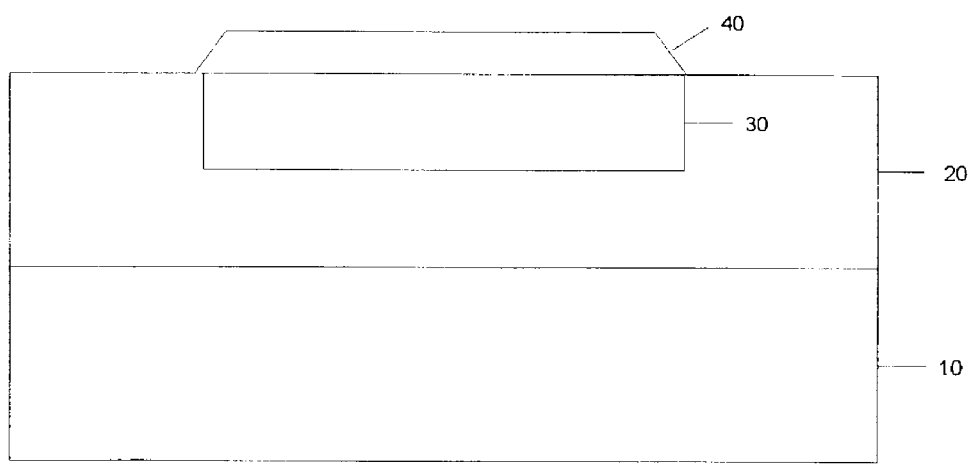

FIG. 2 illustrates a further step in the inventive method, which includes depositing a high temperature diffusion barrier metal cap 40 on the metal layer 30. The high temperature diffusion barrier metal cap 40 may be any metal having both a high melting point and good diffusion barrier characteristics, such as Chromium (Cr), Titanium (Ti), or Titanium Nitride (TiN). The thickness of the high temperature diffusion barrier metal cap 40 is approximately between 500 and 2,500 Å. In an embodiment, the high temperature diffusion barrier metal cap 40 comprises Cobalt Tungsten Phosphorous (CoWP). One advantage of this method is that the CoWP cap is self-patterning, thus eliminating the need to perform an additional patterning step.

In an alternative embodiment, the first dielectric layer 20 and metal layer 30 may be capped with a thick dielectric layer such as, for example, a Nitride cap or an SiCH:N cap, as is well known in the art. This optional step may be omitted, though, as adhesion is not generally a concern in the practice of the present invention.

Figure 3:
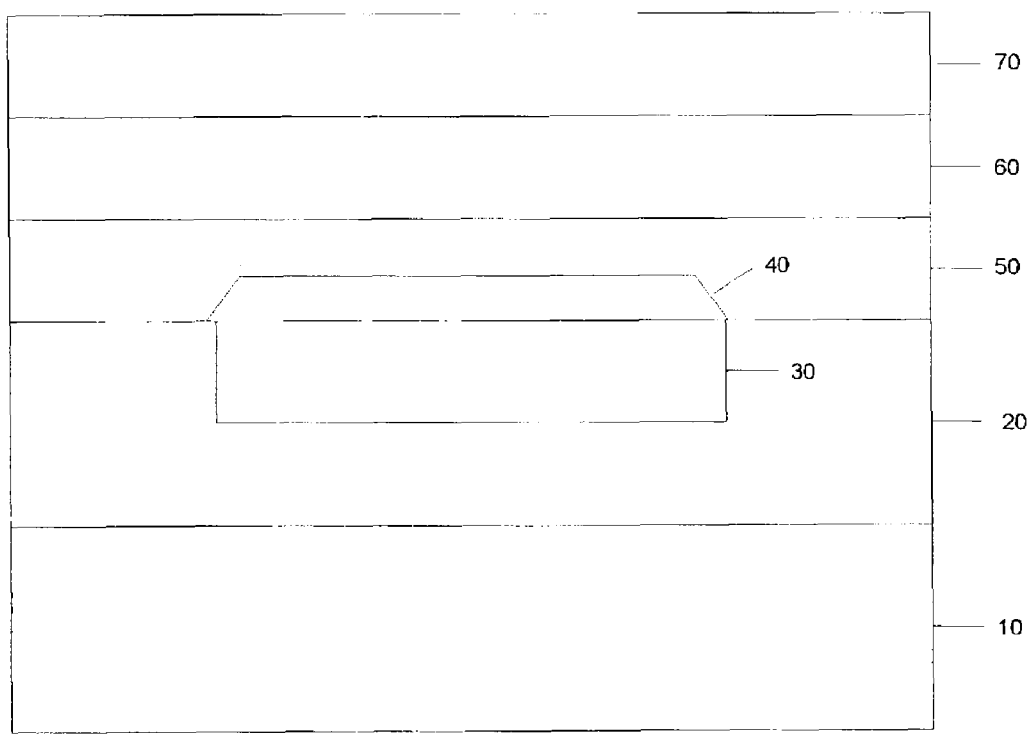

FIG. 3 illustrates a further step in the inventive method, which includes depositing a second dielectric layer comprising an Oxide layer 50, a Nitride layer 60, and a Polyimide layer 70 on the high temperature diffusion barrier metal cap 40 and the first dielectric layer 20. The Oxide layer 50 may be Silicon Dioxide, and may be approximately 4,500 Å deep. The Nitride layer may be Silicon Nitride (Si3N4) and may be approximately 4,000 Å deep. The Polyimide layer may be approximately 4 μm deep.

Figure 4:
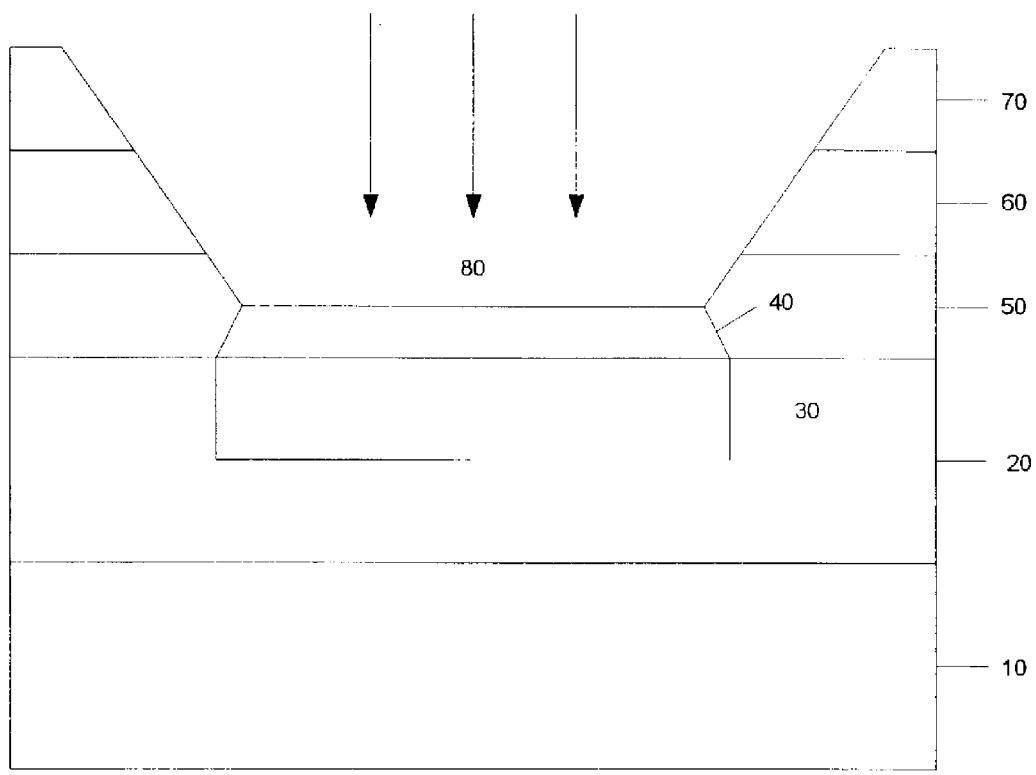

FIG. 4 illustrates a further step in the inventive method, which includes forming a via 80 through the Polyimide layer 70, the Nitride layer 60, and the Oxide layer 50. This via may be approximately 50 to 85 μm wide, and extends through the second dielectric layer exposing the high temperature diffusion barrier metal cap 40. In this way, the via is free of lining metals prior to a formation of the under bump metallurgy layer, thus effectively increasing the area of the via. The via 80 may be formed with successive etching steps after each layer has been deposited. In a preferred embodiment, though, the via 80 may be formed in one etching step after all layers of the second dielectric layer have been deposited.

Figure 5:
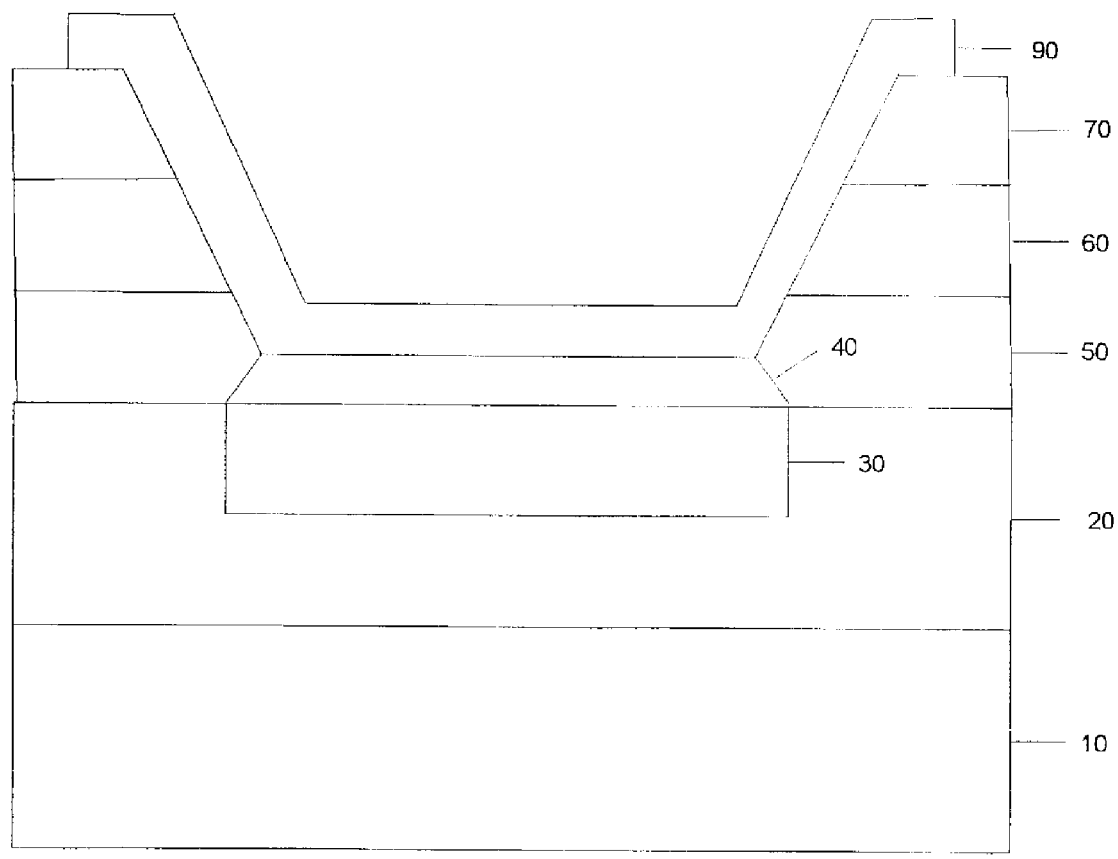

FIG. 5 illustrates a further step in the inventive method, which includes depositing an under bump metallurgy layer (UBM) 90 in the via 80. The UBM layer 90 may be any conventional material such as, for example, a combination of approximately 1,650 Å Titanium Tungsten (TiW), 1,800 Å phased Chromium Copper (CrCu), and 5,000 Å Copper (Cu). An alternate combination is approximately 1,000 Å TiW, 2,000 Å Cu, and 2 μm Nickel (Ni). The UBM selection may be tailored so that it works best with the C4 alloy being used. For example, alloys with high Lead (Pb) percentages may work better with one type of UBM, whereas alloys which are Lead-free may work better with another type of UBM.

Figure 6:
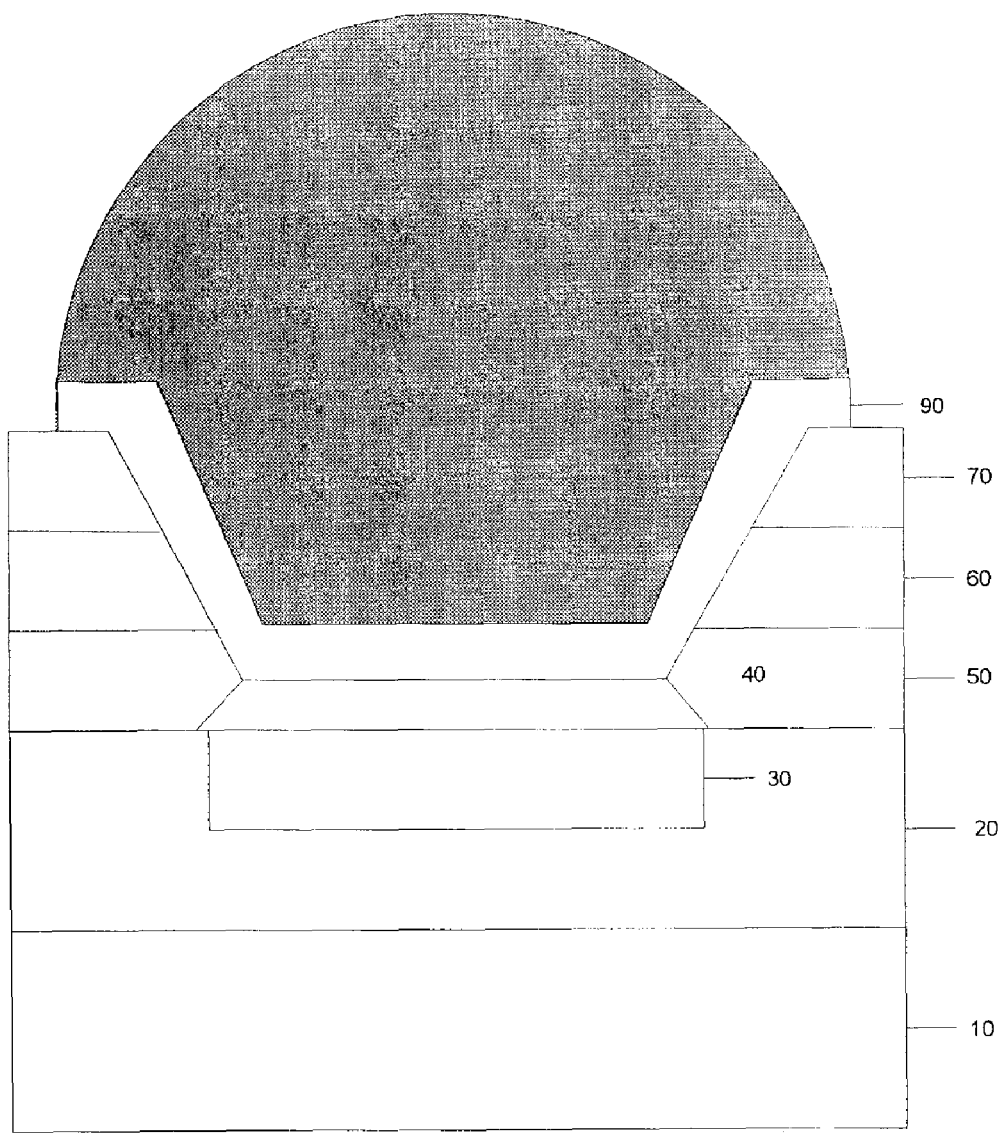

FIG. 6 illustrates a further step in the inventive method, which includes forming a C4 ball 100 on the UBM layer 90. The C4 ball 100 may comprise any conventional material such as, for example, Lead Tin, or a Lead-free C4 solder such as, for example, Tin Copper, or Tin Silver Copper (SnAgCu or SAC).

The method of the present invention allows the formation of the C4 structure with an improved capping material and a simplified process sequence. In this way, the current-carrying capabilities of the C4 structure are increased.

Additionally, the present invention requires less patterning. As discussed above, in a preferred embodiment, the second dielectric layer may be etched in a single step rather than each layer being etched consecutively.

The present invention differs from prior uses of a Cobalt-based capping layer in that in the prior art the Cobalt-based capping layer was employed to cap the Copper conductor within the back end of line structures in order to improve the Copper interconnect electromigration and stress migration. Although this benefit is also seen in the present invention, the purpose of the elimination of the Aluminum layer and the addition of the Cobalt-based capping layer in the present invention is to improve the series resistance of the terminal device metallurgy and the current-carrying capability of the C4 joint.

While the invention has been described in terms of embodiments, those skilled in the art will recognize that the invention can be practiced with modifications and in the spirit and scope of the appended claims.

What is claimed is:

1. A method of manufacturing a structure, comprising the steps of:
    depositing a self patterning high temperature diffusion barrier metal cap on a metal layer formed in a first dielectric layer;
    depositing a second dielectric layer comprising an Oxide layer, a Nitride layer, and a Polyimide layer on the high temperature diffusion barrier metal cap and first dielectric layer;
    etching, in a single etching step, a via into the Oxide layer, the Nitride layer, and the Polyimide layer, exposing the high temperature diffusion barrier metal cap, the via being free of lining material;
    depositing an under bump metallurgy layer in the via which is in contact with the metal cap and the second dielectric layer; and
    forming a controlled collapse chip connections (C4) ball directly on an upper surface of the under bump metallurgy layer,
    wherein no intervening layers are provided between the under bump metallurgy layer deposited directly on the self patterning high temperature diffusion barrier metal cap and the C4 ball, and the under bump metallurgy layer comprises one or a combination of Titanium Tungsten, Chromium Copper, or Nickel.

2. A method of forming an integrated circuit, comprising:
    depositing a self patterning high temperature diffusion barrier metal cap comprising a cobalt based material on a metal layer;
    depositing a dielectric layer comprising an Oxide layer, a Nitride layer, and a Polyimide layer on the high temperature diffusion barrier metal cap;
    etching a via into the dielectric layer, exposing the high temperature diffusion barrier metal cap;
    depositing an under bump metallurgy layer in the via directly on the high temperature diffusion barrier metal cap, wherein prior to the depositing, the via is free of a liner material; and
    forming a controlled collapse chip connections (C4) ball directly on an upper surface of the under bump metallurgy layer.

3. The method of claim 2, wherein high temperature diffusion barrier metal cap comprises Cobalt Tungsten Phosphorous.

4. The method of claim 2, wherein the etching step includes etching through at least two layers in a single etching process.

5. The method of claim 2, wherein:
    the high temperature diffusion barrier metal cap further comprises one or a combination of Cobalt Tungsten Phosphorous, Chromium, Titanium, or Titanium Nitride;
    the under bump metallurgy layer comprises one or a combination of Titanium Tungsten, Chromium Copper, or Nickel; and
    the C4 ball comprises one or a combination of Lead Tin, Tin Copper, or Tin Silver Copper.

6. A device comprising:
    a substrate;
    a dielectric film layer formed on a substrate;
    metal contacts formed within the dielectric film layer;

a high temperature diffusion barrier metal cap comprising a cobalt based self patterning material on the metal contacts;

a second dielectric layer comprising an Oxide layer, a Nitride layer, and a Polyimide layer;

an under bump metallurgy deposited in a via formed throughout the Oxide layer, the Nitride layer, and the Polyimide layer and contacting the high temperature diffusion barrier metal cap; and a solder ball on an upper surface of the under bump metallurgy layer, which is devoid of intervening layers between the under bump metallurgy layer deposited directly on the self patterning high temperature diffusion barrier metal cap and the solder ball.

7. The device of claim 6, wherein the high temperature diffusion barrier metal cap comprises Cobalt Tungsten Phosphorous.

8. The device of claim 6, wherein the under bump metallurgy layer comprises one or a combination of Titanium Tungsten, Chromium Copper, or Nickel.

9. The device of claim 6 wherein the solder ball comprises one or a combination of Lead, Tin, Copper, Silver, Bismuth, Antimony, or Zinc.

* * * * *